US006531911B1

United States Patent
Hsu et al.

(10) Patent No.: US 6,531,911 B1
(45) Date of Patent: Mar. 11, 2003

(54) LOW-POWER BAND-GAP REFERENCE AND TEMPERATURE SENSOR CIRCUIT

(75) Inventors: Louis L. Hsu, Fishkill, NY (US); Rajiv V. Joshi, Yorktown Heights, NY (US); Russell J. Houghton, Essex Junction, VT (US)

(73) Assignee: IBM Corporation, Armonk, NY (US)

( * ) Notice: Subject to any disclaimer, the term of this patent is extended or adjusted under 35 U.S.C. 154(b) by 0 days.

(21) Appl. No.: 09/611,519

(22) Filed: Jul. 7, 2000

(51) Int. Cl.[7] .................. H01L 35/00; H01L 37/00; H03K 3/42; H03K 17/78

(52) U.S. Cl. ........................... 327/512; 327/539

(58) Field of Search ................ 327/512, 513, 327/539; 702/130

(56) References Cited

U.S. PATENT DOCUMENTS

| | | | | |
|---|---|---|---|---|
| 5,039,878 A | * | 8/1991 | Armstrong et al. ......... 307/310 |
| 5,225,811 A | * | 7/1993 | Audy ........................ 340/584 |
| 5,521,489 A | * | 5/1996 | Fukami ...................... 323/313 |
| 5,543,996 A | * | 8/1996 | Nakago ...................... 361/103 |
| 5,774,013 A | * | 6/1998 | Groe ......................... 327/539 |
| 5,873,053 A | | 2/1999 | Pricer et al. ................ 702/130 |
| 5,923,208 A | * | 7/1999 | Tasdighi et al. ............ 327/512 |
| 6,252,209 B1 | * | 6/2001 | Liepold ..................... 219/501 |

* cited by examiner

Primary Examiner—Terry D. Cunningham
Assistant Examiner—Quan Tra
(74) Attorney, Agent, or Firm—Dilworth & Barrese, LLP

(57) ABSTRACT

A combined low-voltage, low-power band-gap reference and temperature sensor circuit is provided for providing a band-gap reference parameter and for sensing the temperature of a chip, such as an eDRAM memory unit or CPU chip, using the band-gap reference parameter. The combined sensor circuit is insensitive to supply voltage and a variation in the chip temperature. The power consumption of both circuits, i.e., the band-gap reference and the temperature sensor circuits, encompassing the combined sensor circuit is less than one $\mu W$. The combined sensor circuit can be used to monitor local or global chip temperature. The result can be used to (1) regulate DRAM array refresh cycle time, e.g., the higher the temperature, the shorter the refresh cycle time, (2) to activate an on-chip or off-chip cooling or heating device to regulate the chip temperature, (3) to adjust internally generated voltage level, and (4) to adjust the CPU (or microprocessor) clock rate, i.e., frequency, so that the chip will not overheat. The combined band-gap reference and temperature sensor circuit of the present invention can be implemented within battery-operated devices having at least one memory unit. The low-power circuits of the sensor circuit extend battery lifetime and data retention time of the cells of the at least one memory unit.

24 Claims, 6 Drawing Sheets

LOW-POWER BAND-GAP REFERENCE AND TEMPERATURE SENSOR CIRCUIT

FIELD OF THE INVENTION

This invention relates to the field of integrated circuit (IC) design. Specifically, it relates to an integrated circuit having a low-voltage, low-power band-gap reference circuit for outputting a reference parameter and a low-voltage, low-power temperature sensor circuit for sensing the on-chip temperature of a semiconductor chip using at least the reference parameter.

BACKGROUND OF THE INVENTION

Semiconductor memory units embedded within an integrated circuit (IC) system are arranged in arrays of cells, where each cell stores one bit of information (1 or 0). Generally, in order to maintain the integrity of the data stored within an embedded semiconductor memory unit, such as an embedded dynamic random access memory unit (eDRAM), each cell of the memory unit requires periodic refreshing, since a small charge stored in each cell of the memory unit tends to leak off due to several factors, such as an increase in the temperature of the chip. Accordingly, circuitry is required to manage or control such semiconductor memory units for refreshing the cells. Hence, these circuits consume power causing a reduction in the lifetime of the battery when these circuits are utilized in hand-held, battery-operated devices.

For instance, the refresh circuitry generally includes several charge circuits which need to be activated to provide different voltage and current supplies to cells and other circuits of the memory unit. These charge circuits consume power which can significantly reduce battery lifetime. Additionally, the consumption of power by these charge circuits causes the chip temperature to increase, thereby decreasing the period of time between refresh cycles of the charge circuits. This further causes a reduction in the battery lifetime, since the charge circuits are activated at a greater frequency.

Furthermore, a respective constant-speed ring oscillator provided in proximity or within the memory unit is generally used to run these charge circuits. A typical frequency range for the oscillator is from 5 MHZ to 50 MHZ depending on the voltage or current required to be produced by the particular charge circuit. Hence, additional power is required to operate the constant-speed ring oscillators.

Since the charge circuits consume a relatively large amount of power, memory units are generally designed with a few or no additional circuits for adding additional features to the memory unit, such as band-gap reference circuit for providing a band-gap reference voltage, and a temperature sensor circuit for approximating the chip temperature. Further, when these additional circuits are added to the memory unit, they not only consume a great amount of power, but, as a consequence of consuming a great amount of power, they further facilitate the increase in the chip temperature. As indicated above, an increase in the chip temperature causes a decrease in the period of time between refresh cycles of the charge circuits, thereby causing the charge circuits to be activated at a greater frequency and consequently, draining the battery at a more rapid rate.

Further, these additional circuits are generally not designed to operate during low-power applications, especially when the supply voltage drops under one volt (a "sub-one voltage"), such that these circuits may be insensitive to the supply voltage. A paper published by Toshiba, Inc. in the *IEEE Journal of Solid State Circuits,* vol. 34, no. 5, page 670, May 1999, proposes a circuit to produce a CMOS band-gap reference voltage ($V_{ref}$), where the circuit is capable of operating with a sub-one volt supply voltage. The paper discusses combining two current flows, one having a positive temperature coefficient and one having a negative temperature coefficient, and converting them to a reference voltage. However, the paper does not teach or discuss how to operate the proposed circuit in a low-power mode.

SUMMARY

An objective of the present invention is to provide a band-gap reference for providing a reference parameter, such as a constant reference voltage, for a semiconductor chip, such as a memory, microprocessor, or logic, where the band-gap reference circuit can be operated at low-voltage and low-power, and is insensitive to supply voltage, variation of fabrication process, and chip temperature.

Another objective of the present invention is to provide an on-chip temperature sensor circuit using the whole or part of the low-power, low-voltage band-gap reference circuit. The temperature sensor circuit can be used to monitor chip temperature for many different purposes, such as control refresh cycle time of DRAM array, adjust clock rate of a microprocessor chip, etc.

Further, another objective of the present invention is to provide a combined low-voltage, low-power band-gap reference and temperature sensor circuit for providing a band-gap reference parameter and for sensing the temperature of a chip, such as an eDRAM memory unit or CPU chip, using the band-gap reference parameter. The combined sensor circuit is insensitive to supply voltage and a variation in the chip temperature. The power consumption of both circuits encompassing the combined sensor circuit is less than one $\mu$W. The combined sensor circuit can be used to monitor local or global chip temperature. The result can be used to (1) regulate DRAM array refresh cycle time, e.g., the higher the temperature, the shorter the refresh cycle time, (2) to activate an on-chip or off-chip cooling or heating device to regulate the chip temperature, (3) to adjust internally generated voltage level, and (4) to adjust the CPU (or microprocessor) clock rate, i.e., frequency, so that the chip will not overheat.

Still, another objective of the present invention is to implement the band-gap reference and temperature sensor circuit having low-power circuits within a battery-operated device having at least one memory unit. The low-power circuits extend battery lifetime and data retention time of the cells of the at least one memory unit.

DETAILED DESCRIPTION OF THE INVENTION

The present invention provides a low-voltage, low-power band-gap reference circuit and a temperature sensor circuit which operate at low-voltage and therefore consume low-power. The band-gap reference circuit is operational by itself and the temperature sensor circuit is operational by being connected to the band-gap reference circuit to form a combined low-voltage, low-power band-gap reference and temperature sensor circuit. The combined band-gap reference and temperature sensor circuit provides a band-gap reference and senses the temperature of a semiconductor chip, such as an eDRAM memory unit, using the band-gap reference. It is contemplated that if a band-gap reference circuit is already provided on a semiconductor chip, the temperature sensor circuit can be connected to the band-gap reference circuit without requiring the use of a band-gap reference circuit described herein to decrease implementation costs.

The combined sensor circuit is insensitive to supply voltage and a variation in the chip temperature. The power consumption of the combined sensor circuit is less than one $\mu$W, which prevents the combined sensor circuit from causing any local heat-up of the chip. The low chip temperature causes the cells of the memory unit to exhibit a low cell leakage which allows for a greater period of time between refresh cycles of the charge circuits, thereby saving chip refresh power.

Additionally, the combined band-gap reference and temperature sensor circuit of the present invention is designed for implementation within battery-operated devices having at least one memory unit. The low-power circuits of the sensor circuit extend battery lifetime and data retention time of the cells of the at least one memory unit by monitoring the chip temperature for many different purposes, such as control refresh cycle time of DRAM array, adjust clock rate of a microprocessor chip, etc.

I. Low-Voltage, Low-Power Band-gap Reference Circuit

The low-voltage, low-power band-gap reference and temperature sensor circuit of the present invention includes a band-gap reference circuit which consumes much less power, especially during the sleep or low-power mode, as compared to prior art band-gap reference circuits, by incorporating high-resistance (high-R) resistors. These high-R resistors are implemented using a thin-film material, such as TaSiN capable of having a sheet resistance up to one M-ohm.

Figure 1A:
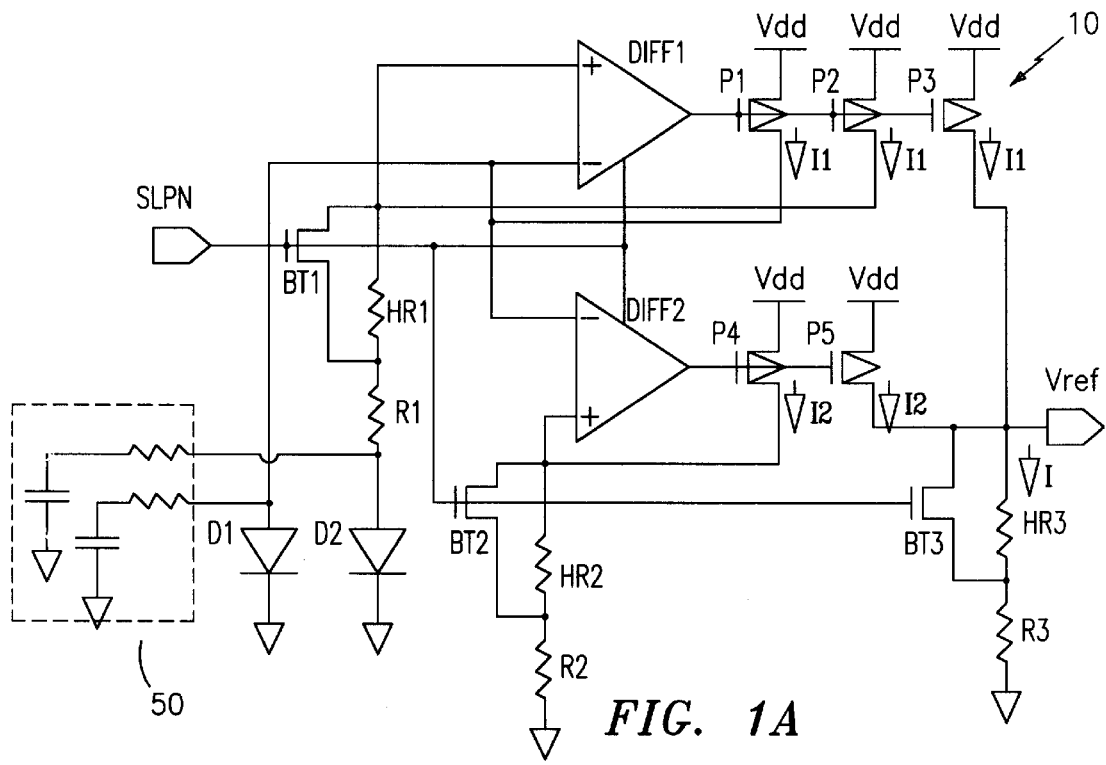
FIG. 1A is a schematic diagram of a low-voltage, low-power band-gap reference circuit according to an embodiment of the present invention.

The low-voltage, low-power band-gap reference circuit is schematically shown by FIG. 1A and designated generally by reference numeral 10. A sleep control (SLPN) signal is used to achieve low-power operations. On each DC path there is a high-R resistor HR1, HR2, HR3, preferably implemented with a thin-film material, having a greater resistance than a respective corresponding series resistor R1, R2, R3.

Preferably, each high-R resistor HR1, HR2, HR3 has nine times more resistance than its corresponding resistor R1, R2, R3, in order to reduce the DC current flow by ten times, when the band-gap reference circuit 10 is operated during low-power operations. During high-power and high-speed operations, the DC current flow on each DC path is increased by deactivating the SLPN signal and the high-R resistors HR1, HR2, HR3 are by-passed and the band-gap reference circuit 10 only includes resistors R1, R2, R3.

Each high-R resistor HR1, HR2, HR3 is in series with its corresponding resistor R1, R2, R3. That is, high-R resistor HR1 is in series with resistor R1, high-R resistor HR2 is in series with resistor R2, and high-R resistor HR3 is in series with resistor R3

The band-gap reference circuit 10 further includes two differential amplifiers Diff1, Diff2, five pMOS transistors P1, P2, P3, P4, P5, three by-pass nMOS transistors BT1, BT2, BT3, and two diodes D1, D2 having different cross-sectional areas. Preferably, the cross-sectional area of diode D2 is approximately sixteen times larger than the cross-sectional area of diode D1.

Figure 1B:
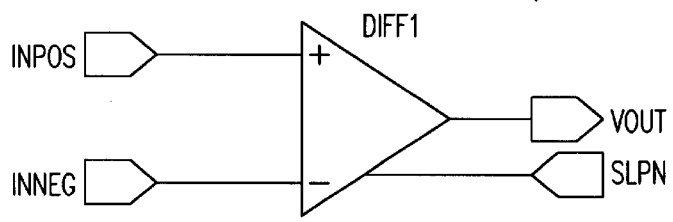
FIG. 1B is a diagram of a differential amplifier of FIG. 1A.

Transistors P1, P2, P3 and P4, P5 are commonly connected via their gates to the output of differential amplifiers Diff1, Diff2, respectively, and with each other to forego any input offset due to mismatches and to equally divide the current output from differential amplifiers Diff1, Diff2, respectively. FIG. 1B illustrates differential amplifier Diff1 with its corresponding output Vout and corresponding inputs: positive input INPOS, negative input INNEG and sleep control signal SLPN, i.e., non-in-sleep mode input.

Figure 1C:
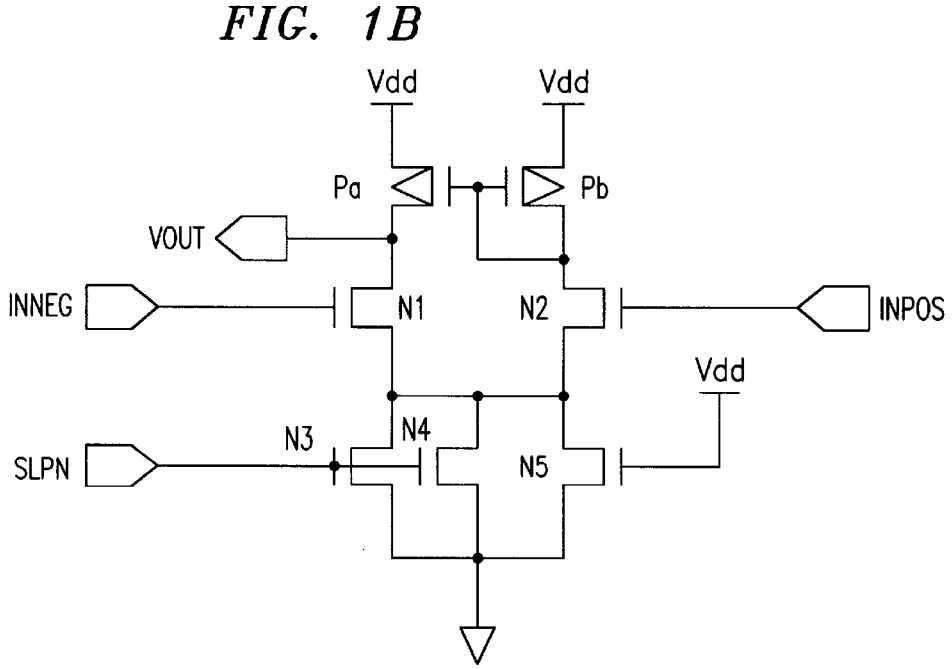
FIG. 1C is a schematic diagram of the differential amplifier of FIG. 1A.

FIG. 1C is a schematic illustration of differential amplifier Diff1. Differential amplifier Diff1 includes two pull up pMOS transistors Pa, Pb, two pull-down nMOS transistors N1, N2, and three current source transistors N3, N4, N5. The positive input INPOS is fed into the gate of transistor N2, and the negative input INNEG is fed into the gate of transistor N1, and the not-in-sleep mode input SLPN is tied to the gates of transistors N3, N4, while the gate of transistor N5 is always tied to the supply voltage, Vdd. When the chip is not in the sleep mode, or in the active mode, a fast response of the differential amplifier Diff1 is expected. At this moment, SLPN=1, the current source is formed by three switched-on nMOS transistors N3, N4, N5. On the other hand, when the chip enters the sleep mode, or SLPN=0, two of the three nMOS current source transistors are shut off, and the DC current of the differential amplifier Diff1 is significantly reduced.

Transistor P2 is connected in series with resistor R1 and diode D2 and transistor P1 is connected in series with diode D1. Transistors P1, P2, P3 have an identical width for equally dividing the current output from differential amplifier Diff1. The source side of transistors P1, P2, P3 is connected to the supply voltage, Vdd. The drain side of transistors P1, P2, P3 is connected to diode D1, resistor R1 and output reference voltage, Vref, respectively. Therefore, the current flow I1, i.e., the current flow from the supply voltage, Vdd, through each transistor P1, P2, P3, can be determined by:

$$I1=(V_{be1}-V_{be2})/R1,$$

where $V_{be1}$ and $V_{be2}$ are the base-emitter voltage across the first and second diodes D1, D2, respectively.

Additionally, transistors P4, P5 have an identical width for equally dividing the current output from the differential amplifier Diff2. Accordingly, since $I1=\ln 16(V_o/R1)$, where $V_o=kT/q$ and sixteen is the diode area ratio between D2 and D1, then the current flow I2, i.e., the current flow from supply voltage, Vdd, through each transistor P4, P5, can be determined by:

$$I2 = V_{be1}/R2.$$

The source side of transistors P4, P5 is connected to the supply voltage, Vdd; the drain side of transistor P4 to resistor R2 and the drain side of transistor P5 to the reference voltage, Vref.

Thus, one of the functions of transistors P1, P2, P3 and P4, P5 is to divide the current sources I1 and I2 among three and two different paths, respectively.

In the preferred band-gap reference circuit 10, $V_{be1}$ has a negative temperature coefficient of about −2 mV per degree Celsius, and $V_o$ ln 16 has a positive temperature coefficient of 0.24 mV per degree Celsius. Bot I1 and I2 are fed to resistor R3 to create a temperature independent reference voltage, Vref. In order to completely cancel out the temperature effect, the R2/R1 ratio must equal to $V_{be1}/(V_o \ln 16)$, or approximately 8.33. The final current I is the sum of I1 and I2, where I1 has a positive temperature coefficient and I2 has a negative temperature coefficient. Hence, I1 and I2 compensate each other and $$I = 1/R2 \ [(R2/R1)(\ln 16)V_o + V_{be1}].$$

In a preferred design embodiment for the band-gap reference circuit 10 of the present invention, in order to obtain a band-gap reference voltage, Vref, of 0.5 volt with a supply voltage, Vdd, of 1.0 volt, R1, R2 and R3 are chosen to have resistance of 10 k-ohms, 83.3 k-ohms and 34.7 k-ohms, respectively. This is because the band-gap reference voltage, Vref, is calculated as follows:

$$Vref = (I1+I2)R3 = (R3/R2)[(R2/R1)(V_o \ln 16) + V_{be1}].$$

In further detail and with continued reference to FIG. 1, one of the bypass transistors BT1, BT2, BT3 is added to each of the high-R resistors HR1, HR2, HR3. In the normal mode or high-power, high-speed operations, the high-R resistors HR1, HR2, HR3 are by-passed and the band-gap reference circuit 10 only sees resistors R1, R2, R3. In sleep or low-power operations, the DC current at each differential amplifier Diff1, Diff2 is also reduced.

It is contemplated, in order to reduce the power consumed by the differential amplifiers Diff1, Diff2, to reduce the size of the current sources by a predetermined number of times during low-power operations. As a result, the power savings during low-power operations, i.e., during the sleep or low-power mode, will be increased. It is also contemplated to add a RC filter to the band-gap reference circuit 10 to limit the switching speed of the diodes D1, D2, in order to avoid switching noise from being coupled to the band-gap reference voltage, Vref, as shown by the dotted box designated by reference numeral 50 in FIG. 1A.

Figure 2:
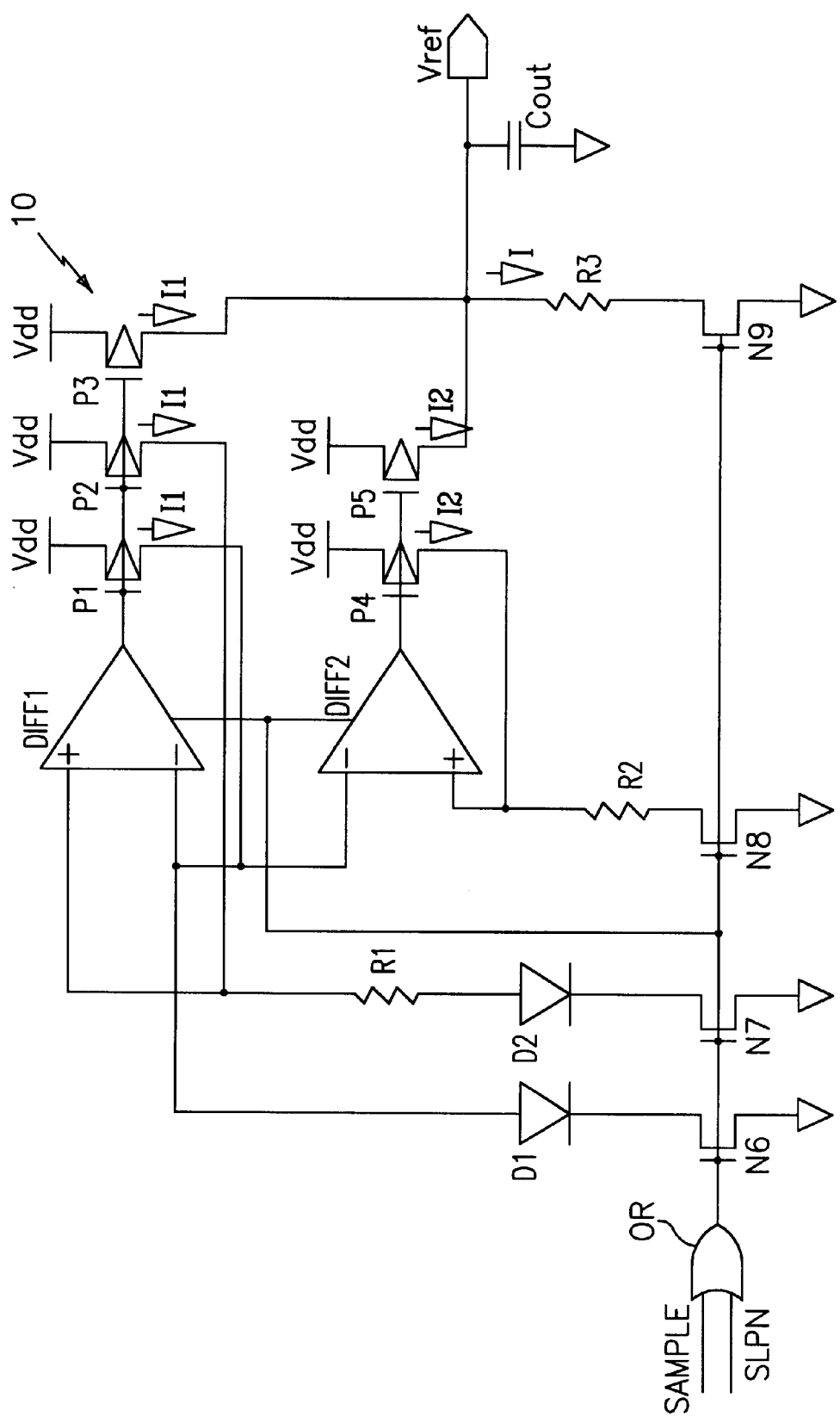
FIG. 2 is a schematic diagram of a low-voltage, low-power band-gap reference circuit having a sampling mode according to the present invention.

With reference to FIG. 2, a sample mode is added to the band-gap reference circuit 10. The sample mode allows the sampling of the band-gap reference voltage, Vref, during low-power operations. That is, one can OR the sleep control (SLPN) signal and sample (or refresh) signals to sample the band-gap reference voltage, Vref, during low-power operations. This feature lets the band-gap reference voltage, Vref, float at a low voltage level during low-power operations or a low-power period, and the sample or refresh signal restores (or resets) the band-gap reference voltage, Vref, up to the target voltage level before the refresh operation or high-power operations. The refresh operation will then refresh the cells of the memory unit, such as the eDRAM. When the refresh operation has been completed, the refresh signal is terminated and the band-gap reference voltage, Vref, returns to the low voltage mode.

In greater detail, with continued reference to FIG. 2, the SLPN and SAMPLE signals are fed into the OR gate. The output of the OR gate controls the switch of all the DC paths. In the embodiment shown by FIG. 2, there are four DC paths; each one is connected to an nMOS transistor N6, N7, N8, N9. In normal operations or when SLPN=1, the band-gap reference circuit 10 operates in a DC mode, i.e., not in the sample mode. At this moment, all the switches are turned on, DC current flows through each path, and a constant reference voltage, Vref, is established.

In the sleep mode or when SLPN=0, the switches are not turned on until SAMPLE=1. When SAMPLE=1, the reference voltage, Vref, is established and the level of the reference voltage, Vref, is held by an output capacitor Cout. When the SAMPLE=0, the reference voltage, Vref, is left floating and its level is drifted lower gradually depending on the leakage condition. It is desirable to sample the reference voltage, Vref, before it drifts below a predetermined level, for example, to refresh a DRAM array. It is contemplated to use low-resistance resistors for a better response time, since the sampling period is relatively short.

As discussed above, with respect to the low-voltage, low-power band-gap reference circuit 10, a temperature dependent voltage can be generated, i.e., via a positive temperature coefficient component or a negative temperature coefficient component. In addition, one can also generate a temperature independent voltage by combining the positive temperature coefficient component and the negative temperature coefficient component.

More specifically, the band-gap reference circuit 10 can output a first current I1 (or first voltage, by multiplying the output current with a resistor ratio) with a positive temperature coefficient and a second current I2 (or second voltage) with a negative temperature coefficient. Further, the band-gap reference circuit 10 can create a third voltage, i.e., band-gap reference voltage, Vref, (or third current, by dividing the third voltage with a resistor ratio), which is independent of the temperature, from the sum of the first and second currents.

II. Low-Voltage, Low-Power Temperature Sensor Circuit

A. A First Embodiment

A low-voltage, low-power band-gap reference and temperature sensor circuit can be realized by applying a temperature independent voltage Vref from a band-gap reference circuit as shown by FIGS. 1A and 2 to a temperature sensor circuit as described below. For example, a temperature independent voltage reference Vref from the band-gap reference circuit of FIG. 1A can be applied to an input of a differential amplifier and a temperature dependent reference voltage Vi, where i=1, 2, 3 or 4, obtained from a positive temperature dependent branch or from a negative temperature dependent branch, can be fed to the negative input of the same differential amplifier. When the temperature independent voltage curve intersects with the temperature dependent voltage curve, a predetermined temperature index is read.

Figure 3:
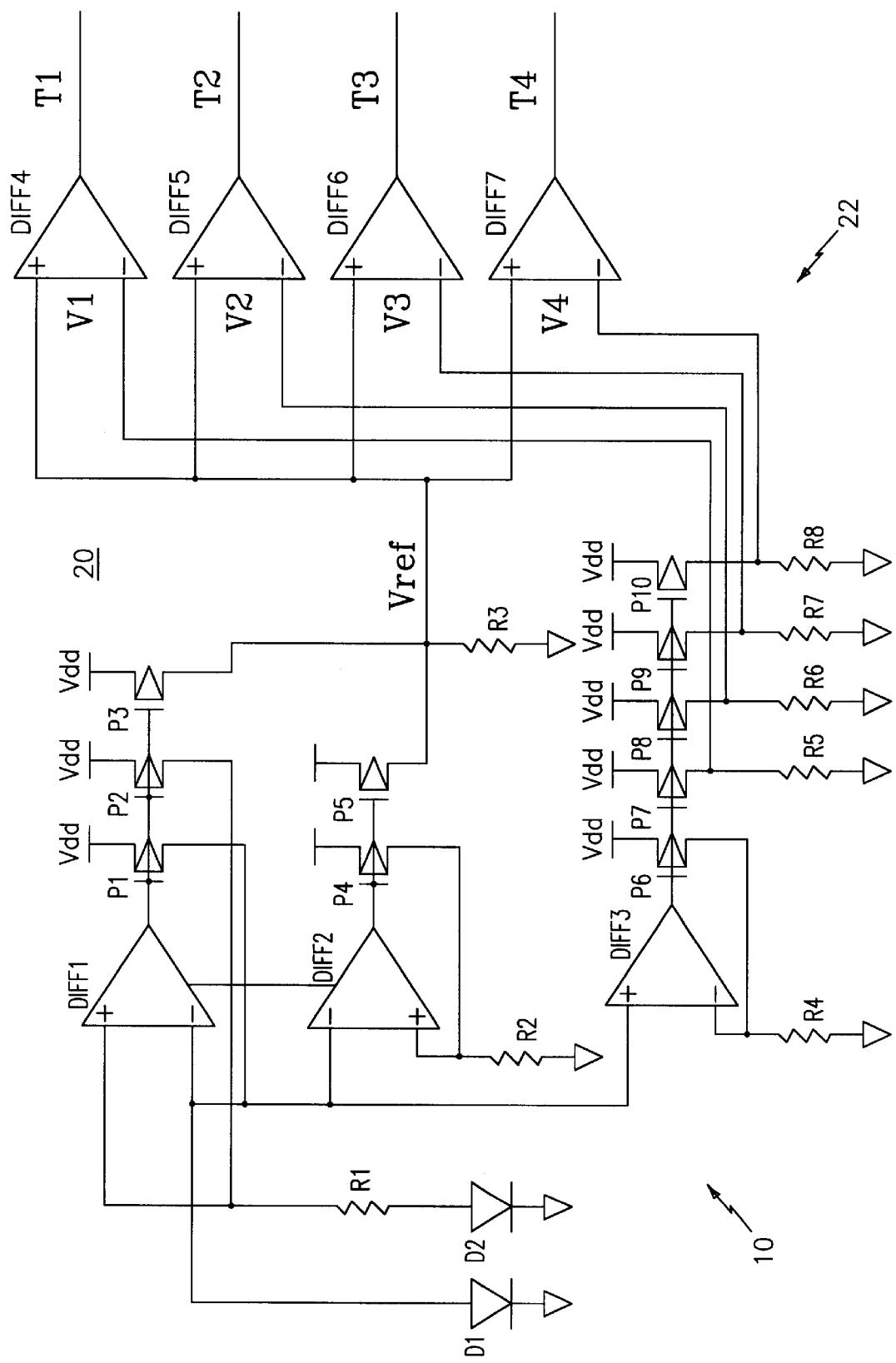
FIG. 3 is a schematic diagram of a first embodiment of a combined low-voltage, low-power band-gap reference and temperature sensor circuit according to the present invention.

A first embodiment of a band-gap reference and temperature sensor circuit is shown by FIG. 3 and designated generally by reference numeral 20. Sensor circuit 20 includes the band-gap reference circuit 10 described above and a temperature sensing circuit 22. It is noted that the by-pass transistors BT1, BT2, BT3 the high-R resistors HR1, HR2, HR3 and the SLPN signal are not shown by FIG. 3 for simplicity. FIG. 3 is illustrated as operating during normal power operations when these elements are by-passed by a low SLPN signal.

The band-gap reference circuit 10 generates a negative temperature coefficient voltage. The negative temperature coefficient voltage is from the $V_{be1}$ component that is fed to the negative ports of the two differential amplifiers Diff1, Diff2.

A third differential amplifier Diff3 is used to produce the temperature dependent voltages to complete the temperature sensor circuit 22. Accordingly, the voltage lines or group of negative temperature coefficient lines V1, V2, V3, V4 are the product of $V_{be1}$ and Ri/R4, where Ri refers to one of the following resistors: R5, R6, R7, R8. For example, V1=$V_{be1}$(R5/R4), where Ri=R5.

Resistors R5, R6, R7, R8 are in series with a corresponding transistor P7, P8, P9, P10. These transistors are commonly connected via their gates with each other and with transistor P6 to forego any input offset due to mismatches and to equally divide the current output from differential amplifier Diff3. Additionally, these transistors P6, P7, P8, P9, P10 have an identical width to equally divide the current output from differential amplifier Diff3.

Each resistor R5, R6, R7, R8 is connected to a corresponding differential amplifier Diff4, Diff5, Diff6, Diff7 for outputting temperature dependent voltages T1, T2, T3, T4 which correspond to a point on the group of negative temperature coefficient lines V1, V2, V3, V4 depending on the on-chip temperature. It is contemplated that the value of each temperature dependent voltage T1, T2, T3, T4 is determined digitally by using a voltage meter or some other voltage measuring device.

Figure 4:
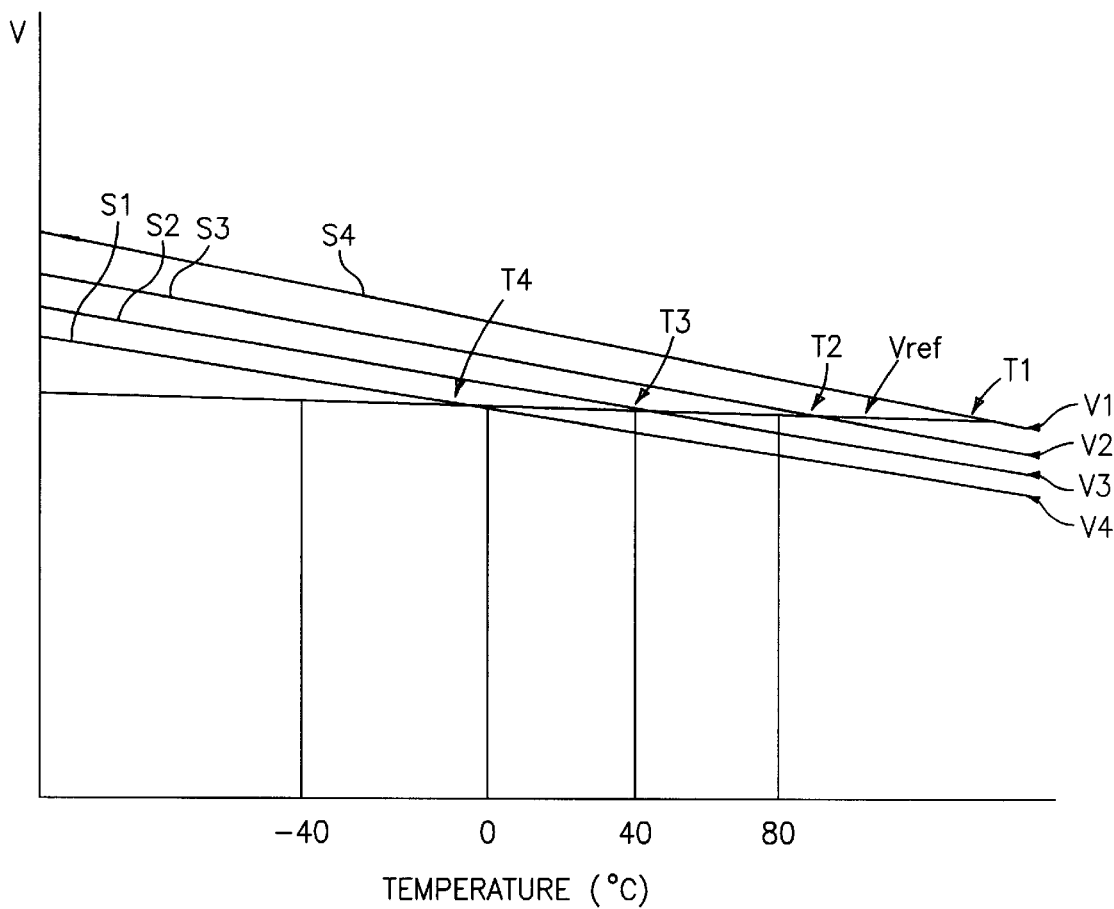
FIG. 4 is a chart illustrating voltage versus temperature for the embodiment shown by FIG. 3.

As shown by FIG. 4, by properly choosing a set of Ri values for the temperature sensor circuit 20, one can get different monitoring temperatures by intersecting the group of negative temperature coefficient lines V1, V2, V3, V4 to the band-gap reference voltage line, Vref line. As mentioned above, Vref is a temperature independent band-gap reference voltage.

For example, by choosing the ratio of R5/R4 to be 0.7 and applying the slope equation S=−2(Ri/R4) mV/C, then the negative coefficient line V1 which intersects the Vref line and corresponds to temperature dependent voltage T1 has a slope of −1.4 mV per degree Celsius (S4) and intersects the Vref line when the on-chip temperature is approximately eighty degrees Celsius as indicated by FIG. 4.

Similarly, if the R6/R4 ratio is chosen to be 0.6, then the negative coefficient line V2 which intersects the Vref line and corresponds to temperature dependent voltage T2 has a slope of −1.2 mV per degree Celsius (S3) and intersects the Vref line when the on-chip temperature is approximately forty degrees Celsius. Likewise, if the R7/R4 ratio is chosen to be 0.5, then the negative coefficient line V3 which intersects the Vref line and corresponds to temperature dependent voltage T3 has a slope of −1.0 mV per degree Celsius (S2) and intersects the Vref line when the on-chip temperature is approximately zero degrees Celsius. Still, if the R8/R4 ratio is chosen to be 0.4, then the V4 line which intersects the Vref line and corresponds to temperature dependent voltage T4 has a slope of −0.8 mV per degree Celsius (S1) and intersects the Vref line when the on-chip temperature is minus forty degrees Celsius.

Accordingly, one can sense the on-chip temperature using the first embodiment of the band-gap reference and temperature sensor circuit 20 as shown by FIG. 3 by correlating the temperature dependent voltages T1, T2, T3, T4 with the chart of FIG. 4. For example, if the temperature dependent voltage T1 is determined to be 0.7 V, then it can be observed from FIG. 4 that the on-chip temperature is less than eighty degrees Celsius. This is because the negative coefficient line V1 which corresponds to the temperature dependent voltage T1 intersects the Vref line (which is equal to 0.5 V in the illustrated example) when the on-chip temperature is approximately eighty degrees Celsius, as indicated above. Therefore, when the voltage is greater than Vref (i.e., 0.5 V in the illustrated example), the on-chip temperature corresponds to a temperature reading which is to the left of the intersection point between the Vref line and the V1 line. If, on the other hand, the temperature dependent voltage T1 is determined to be less than Vref, it is determined that the on-chip temperature is greater than eighty degrees Celsius. The same process is used to determine the on-chip temperature when using the other three temperature dependent voltages T2, T3, T4.

The results obtained can be used to adjust the DRAM refresh cycle time. For example, if the temperature is high, the refresh cycle time can be shortened. Further, the results can be used to reduce the cycle frequency of the CPU chip to avoid overheating. Additionally, the results can be used to activate an on-chip or off-chip cooling device to chill the chip.

It is contemplated to input the output of differential amplifiers Diff4, Diff5, Diff6, Diff7 to a voltage measuring device having voltage measuring circuitry and a processor storing programmable instructions therein for measuring the temperature dependent voltages T1, T2, T3, T4 and correlating these voltages with data indicative of the chart shown by FIG. 4 to determine the on-chip temperature. The data can be stored within the processor, a memory of the voltage measuring device, or within a remote database accessible by the processor by a network data connection, such as an internet, local area network (LAN), wide area network (WAN), public switched telephone network (PSTN) or other data connection.

It is further contemplated that other methods can be employed using the band-gap reference and temperature sensor circuit 30 to determined the on-chip temperature. For example, it is contemplated that one can use a set of positive temperature coefficient voltage lines from the kT/q component to intersect the Vref line at different temperature points for sensing the on-chip temperature.

It is further contemplated to divide the set of negative temperature coefficient voltage lines V1, V2, V3, V4 with a resistor value to obtain a set of negative temperature coefficient current lines and to use a positive temperature current line as a reference to intersect the set of negative temperature coefficient current lines. It is further contemplated to use a negative temperature current line as a reference to intersect a set of positive voltage slope lines.

It is further contemplated that the sampling method described above with reference to FIG. 1 can be implemented to save power. That is, the band-gap reference voltage or current is left floating when the circuit is idle, i.e., during low-power operations, and quickly restored at a fixed level during high-power operations.

The temperature sensor circuit 20 of the present invention is less sensitive to process variations, such as variations of device dimensions, channel doping, annealing conditions, etc., since Vref is independent of the temperature. Further, the sensor circuit 20 can operate at low-voltage, even below one volt, and is also suitable for using the sampling technique for conserving power. In the sampling mode, the chip's temperature is measured periodically in order to save power.

B. A Second Embodiment

Figure 5:
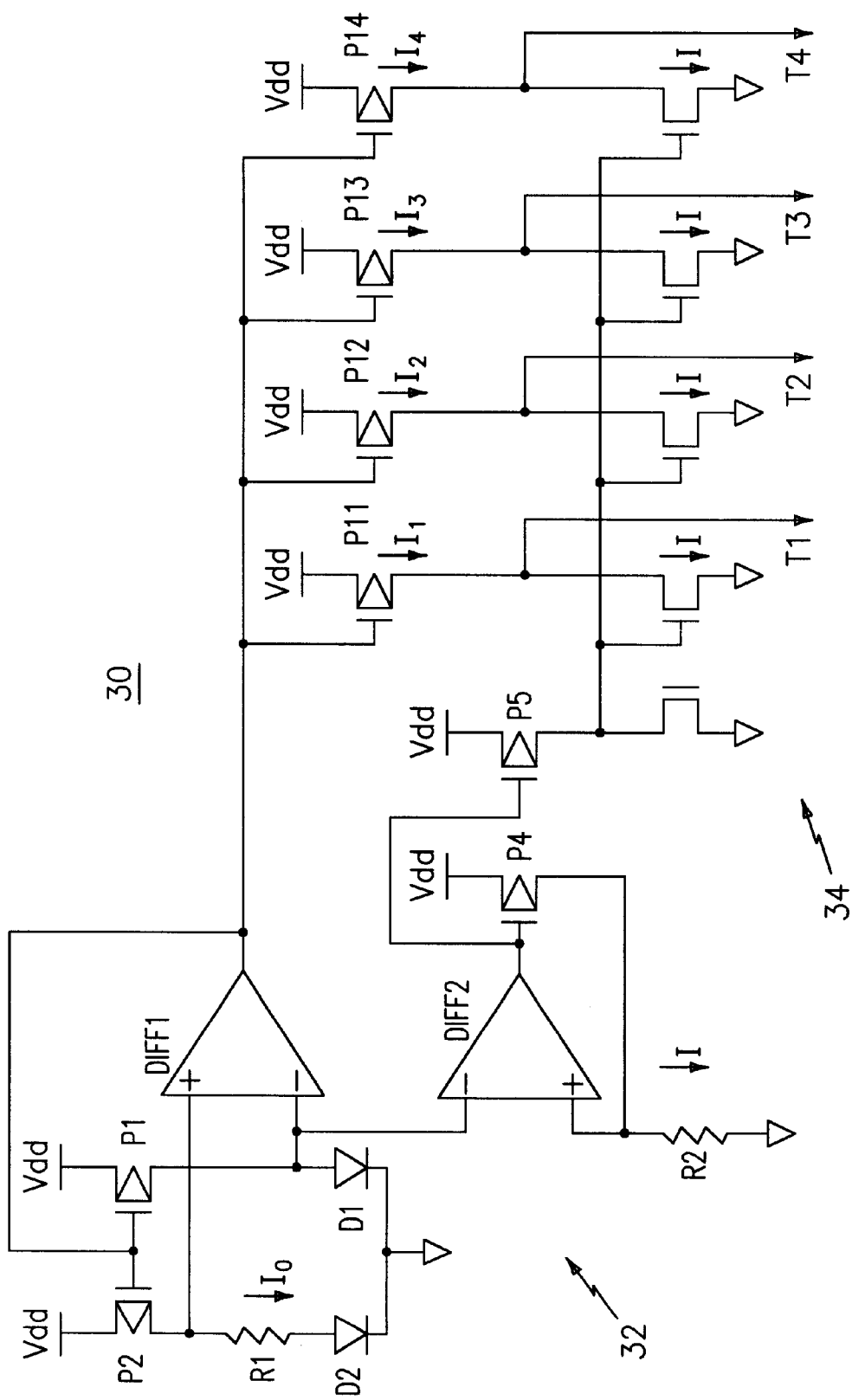
FIG. 5 is a schematic diagram of a second embodiment of a combined low-voltage, low-power band-gap reference and temperature sensor circuit according to the present invention.

A second embodiment of the band-gap reference and temperature sensor circuit of the present invention is shown by FIG. 5 and designated generally by reference numeral 30. Sensor circuit 30 includes a band-gap reference circuit 32 and a temperature sensing circuit 34. Sensor circuit 30 uses the concept of positive and negative temperature slope current components to perform temperature sensing.

The band-gap reference circuit 32 is almost identical to band-gap reference circuit 10 described above with reference to the first embodiment. It is noted that band-gap reference circuit 32 is schematically illustrated in a different configuration than band-gap reference circuit 20. Further, it is noted that the by-pass transistors BT1, BT2, the high-R resistors HR1, HR2 and the SLPN signal are not shown by FIG. 5, since FIG. 5 is illustrated as operating during normal power operations when these elements are by-passed by a low SLPN signal.

Band-gap reference circuit 32 includes two differential amplifiers Diff1, Diff2, two diodes D1, D2, two resistors R1, R2 (resistor R3 has been eliminated), transistors P1, P2, P4, P5 (transistor P3 has been eliminated). Preferably, diode D2 is approximately sixteen times larger in surface area than diode D1.

The first current component, I, from the band-gap reference circuit 32 has a negative temperature dependent or a negative slope. That is, when the temperature increases, the first current component, I, decreases. Accordingly, the first current component, I, is used as the universal reference current and has a low-current value.

Figure 6:
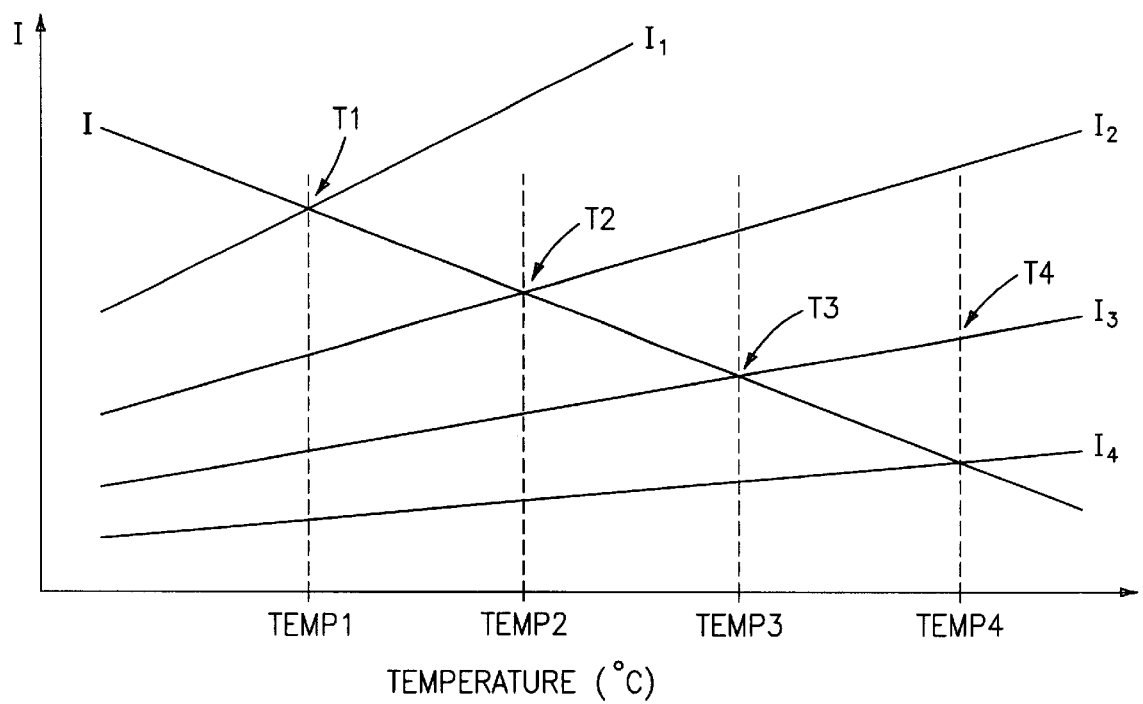
FIG. 6 is a chart illustrating current versus temperature for the embodiment shown by FIG. 5.

The second current component, Io, from the band-gap reference circuit 32 has a positive temperature dependent and a low-current value. This current is mirrored and multiplied by a ratio of about Wi/Wo, where Wi (i=I1, I2, I3, I4) corresponds to the width of transistors P11, P12, P13, P14 of the temperature sensing circuit 34 and Wo is the width of transistors P1, P2, P4, P5 to form a set of positive current slope lines I1, I2, I3, I4 with different levels of offsets, as illustrated by FIG. 6. Wi is properly sized so that the desired temperature is accurately monitored.

To determine the on-chip temperature, the first current component, I, is compared with Ii, i.e., where i=I1, I2, I3, I4 to designate the current flowing through transistors P11, P12, P13, P14. When Ii>I, a corresponding temperature dependent current Ti will be flagged to show the corresponding on-chip temperature as indicated by FIG. 6. For example, If the temperature dependent current T1 is flagged when the first current component, I, is compared with Ii, then the on-chip temperature is determined to be approximately equal to Temp1.

If the temperature dependent current T2 is flagged, then the on-chip temperature is determined to be approximately equal to Temp2. If the temperature dependent current T3 is flagged, then the on-chip temperature is determined to be approximately equal to Temp3. If the temperature dependent current T4 is flagged, then the on-chip temperature is determined to be approximately equal to Temp4.

It is contemplated that the drain of each transistor P11, P12, P13, P14 can be connected to a current measuring device having current measuring circuitry and a processor storing programmable instructions therein for measuring the temperature dependent currents T1, T2, T3, T4 and correlating these currents with data indicative of the chart shown by FIG. 6 to determine the on-chip temperature. The data can be stored within the processor, a memory of the voltage measuring device, or within a remote database accessible by the processor by a network data connection, such as an internet, local area network (LAN), wide area network (WAN), public switched telephone network (PSTN) or other data connection.

It is further contemplated that other methods can be employed using the band-gap reference and temperature sensor circuit 30 to determined the on-chip temperature. For example, it is contemplated to have the reference current have a positive temperature current line and intersect a set of negative current lines. It is further contemplated to multiply the set of positive current lines I1, I2, I3, I4 with a resistor value to obtain a set of positive voltage lines and to use a negative temperature voltage line as a reference to intersect the set of positive voltage lines. It is further contemplated to use a positive temperature voltage line as a reference to intersect a set of negative voltage lines.

It is further contemplated that the sampling method described above with reference to FIG. 1 can be implemented to save power. That is, the band-gap reference voltage or current is left floating when the circuit is idle, i.e., during low-power operations, and quickly restored at a fixed level during high-power operations.

The low-voltage, low-power band-gap reference and temperature sensor circuits of the present invention can be added to most semiconductor chips to be able to obtain a temperature independent reference voltage, Vref, or temperature dependent reference current, I, and also to be able to sense the on-chip temperature. The sensor circuits are insensitive to supply voltage.

The sensor circuits described herein do not consume a great amount of power and operate accurately, even when the supply voltage is less than one volt. The power consumption of the sensor circuits is less than one $\mu$W, which prevents the sensor circuits from causing any local heat-up of the chip.

Additionally, the band-gap reference and temperature sensor circuits are designed for implementation within battery-operated devices having at least one memory unit. The low-power circuits extend battery lifetime.

What has been described herein is merely illustrative of the application of the principles of the present invention. For example, the functions described above and implemented as the best mode for operating the present invention are for illustration purposes only. Other arrangements and methods may be implemented by those skilled in the art without departing from the scope and spirit of this invention.

We claim:

1. A temperature sensor circuit for an integrated circuit chip, said circuit comprising:
    means for generating a reference parameter, comprising:
        a first and a second diode, where said second diode is connected in series with a first resistor;
        a first amplifier having a positive input connected to said first resistor and a negative input connected to said first diode, said first amplifier having an output outputting a current output, said output being connected to at least a first set of transistors; and
        a second amplifier having a negative input connected to said first diode and a positive input connected to a second resistor, said second amplifier having an output outputting a current output, said output being connected to at least a second set of transistors; and
    means for sensing the on-chip temperature of said integrated circuit chip by utilizing at least said reference parameter,
    wherein said temperature sensor circuit is capable of operating when a supply voltage is less than or equal 1.0 volt.

2. The sensor circuit according to claim 1, wherein said reference parameter is a temperature independent band-gap reference voltage.

3. The sensor circuit according to claim 1, wherein said reference parameter is a temperature dependent band-gap reference current.

4. The sensor circuit according to claim 1, wherein said second diode has a cross-sectional area which is approximately sixteen times larger than the cross-sectional area of said first diode.

5. The sensor circuit according to claim 1, wherein said current output of said first amplifier and said current output of said second amplifier are added and multiplied by a resistor value to obtain a band-gap reference voltage.

6. The sensor circuit according to claim 1, wherein said current output of said first amplifier has a positive temperature coefficient and said current output of said second amplifier has a negative temperature coefficient.

7. The sensor circuit according to claim 1, wherein said current output of said first amplifier is mirrored and multiplied by a ratio of about Wi/Wo, where Wi corresponds to the width of one of four transistors of said means for sensing said on-chip temperature and Wo corresponds to the width of said at least said first set of transistors.

8. The sensor circuit according to claim 1, wherein said reference circuit further comprises a third resistor coupled to at least one of said second set of transistors.

9. The sensor circuit according to claim 8, wherein said reference circuit further comprises:
- a first by-pass transistor parallel to a first high-resistance resistor in series with said first resistor;
- a second by-pass transistor parallel to a second high-resistance resistor in series with said second resistor;
- a third by-pass transistor parallel to a third high-resistance resistor in series with said third resistor; and
- means for receiving a control signal connected to said first, second and third by-pass transistors, wherein said control signal controls whether said reference circuit by-passes said first, second and third high-resistance resistors to reduce the DC current when said reference circuit is operated during low-power operations.

10. The sensor circuit according to claim 8, wherein said first resistor has a resistance value of approximately 10 k-ohms, said second resistor has a resistance value of approximately 83 k-ohms, and said third resistor has a resistance value of approximately 35 k-ohms.

11. The sensor circuit according to claim 9, wherein said first high-resistance resistor, said second high-resistance resistor and said third high-resistance resistor have a resistance value of approximately nine times the resistance value of said first resistor, second resistor and said third resistor, respectively.

12. The sensor circuit according to claim 1, wherein said means for sensing said on-chip temperature includes a temperature sensing circuit comprising:
- a third amplifier having a positive input connected to said first diode and a negative input connected to a fourth resistor, said third amplifier having an output outputting a current output, said output being connected to at least a third set of transistors;
- a fifth resistor connected to a first transistor of said at least said third set of transistors;
- a sixth resistor connected to a second transistor of said at least said third set of transistors;
- a seventh resistor connected to a third transistor of said at least said third set of transistors;
- a eight resistor connected to a fourth transistor of said at least said third set of transistors;
- a set of amplifiers having a positive input connected to a corresponding one of said fifth, sixth, seventh and eighth resistors and a negative input connected to said reference parameter, each of said set of amplifiers having an output outputting a temperature dependent voltage.

13. The sensor circuit according to claim 1, wherein said means for sensing said on-chip temperature includes a temperature sensing circuit comprising:
- a third set of transistors having different widths connected to said output of said first amplifier and a corresponding transistor of a fourth set of transistors; and
- a transistor being connected to each of said fourth set of transistors and at least one of said second set of transistors, each of said third set of transistors outputting a temperature dependent current.

14. The sensor circuit according to claim 8, further comprising means for sampling the reference parameter.

15. The sensor circuit according to claim 14, wherein said means for sampling the reference parameter comprises:
- means for establishing the reference parameter;
- means for holding the value of the reference parameter; and
- means for floating the value of the reference parameter to a predetermined level.

16. The sensor circuit according to claim 15, wherein said means for establishing the reference parameter comprises:
- a logic gate having at least one output and at least two inputs for receiving a sampling signal and a control signal; and
- a set of transistors for receiving the at least one output and establishing the reference parameter according to the logic level of the at least two inputs, where a corresponding transistor of said set of transistors is in series with said first diode, said second diode, said second resistor, and said third resistor.

17. The sensor circuit according to claim 16, wherein said logic gate is an OR gate.

18. The sensor circuit according to claim 15, wherein said means for holding the value of the reference parameter is a capacitor connected to at least one of said second set of transistors.

19. A method for sensing the on-chip temperature of an integrated circuit chip, said method comprising:
- generating a reference parameter;
- sensing the on-chip temperature of said integrated circuit chip by utilizing at least said reference parameter;
- sampling said reference parameter during low-power operations; and
- providing a signal to set said reference parameter to a target value prior to initiating high-power operations.

20. The method according to claim 19, wherein said step of generating said reference parameter comprises the steps of:
- generating a first current having a negative temperature coefficient and a second current having a positive temperature coefficient; and
- summing portion of said first and second currents and multiplying the sum with a resistance value.

21. The method according to claim 19, wherein said step of sensing said on-chip temperature of said integrated circuit chip by utilizing said reference parameter comprises the steps of:
- plotting a voltage versus temperature chart;
- plotting a voltage value corresponding to said reference parameter on said voltage versus temperature chart; and plotting a set of temperature dependent voltage slope lines on said voltage versus temperature chart, wherein said set of temperature dependent voltage slope lines correspond to temperature dependent voltage slope lines measured using a band-gap reference and temperature sensor circuit, wherein the on-chip temperature of said integrated circuit chip is approximately equal to the temperature corresponding to a point where at least one of said set of temperature dependent voltage slope lines approximately intersects said voltage value corresponding to said reference parameter.

22. The method according to claim 21, wherein said reference parameter is a temperature independent band-gap reference voltage having a low-voltage value.

23. The method according to claim 19, wherein said step of sensing said on-chip temperature of said integrated circuit chip by utilizing said reference parameter comprises the steps of:

plotting a current versus temperature chart;

plotting a temperature dependent current slope line corresponding to a temperature dependent current slope line measured using a band-gap reference and temperature sensor circuit on said current versus temperature chart; and plotting a set of temperature dependent current slope lines on said current versus temperature chart, wherein said set of temperature dependent current slope lines correspond to temperature dependent current slope lines measured using said band-gap reference and temperature sensor circuit, wherein the on-chip temperature of said integrated circuit chip is approximately equal to the temperature corresponding to a point where at least one of said set of temperature dependent current slope lines approximately intersects said temperature dependent current slope line.

24. A temperature sensor circuit for an integrated circuit chip, said circuit comprising:

means for generating a reference parameter, said means for generating a reference parameter having a reference circuit, comprising:

a first and a second diode, where said second diode is connected in series with a first resistor;

a first amplifier having a positive input connected to said first resistor and a negative input connected to said first diode, said first amplifier having an output outputting a current output, said output being connected to at least a first set of transistors; and a second amplifier having a negative input connected to said first diode and a positive input connected to a second resistor, said second amplifier having an output outputting a current output being connected to at least a second set of transistors; and means for sensing the on-chip temperature of said integrated circuit chip by utilizing at least said reference parameter.

* * * * *